Figure 1:
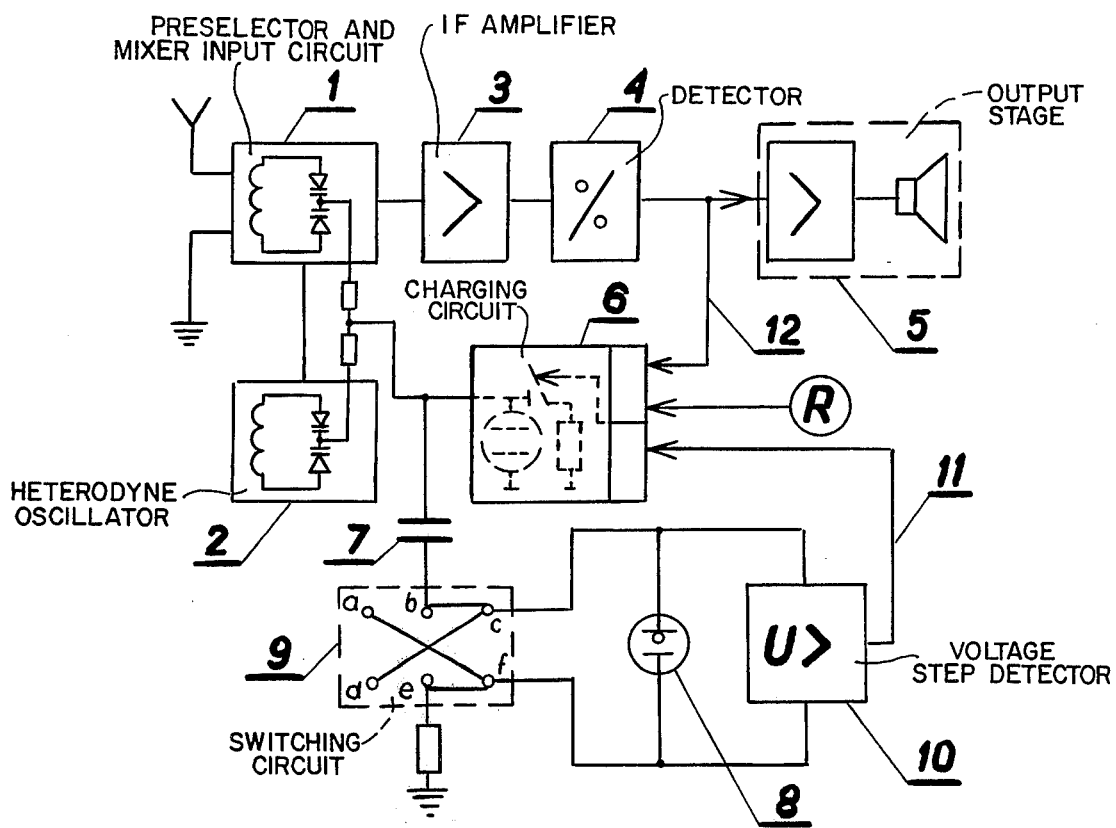

United States Patent [19]

Wróblewski

[11] 4,011,514
[45] Mar. 8, 1977

[54] MEMORY CIRCUIT FOR TUNING OF AN ELECTRONICALLY TUNED RECEIVER TO A PRESELECTED STATION

[75] Inventor: Jerzy Wróblewski, Warsaw, Poland

[73] Assignee: UNITECH Przedsiebiorstwo Techniczno-Hand-Lowe, Warsaw, Poland

[22] Filed: Apr. 28, 1975

[21] Appl. No.: 572,443

[30] Foreign Application Priority Data

May 6, 1974 Poland .................................. 170845

[52] U.S. Cl. .............................. 325/464; 325/468; 325/469
[51] Int. Cl.² .................................................. H04B 1/16
[58] Field of Search ........................ 325/468–470, 325/453, 457, 464

[56] References Cited

UNITED STATES PATENTS

| | | | |
|---|---|---|---|
| 3,588,706 | 6/1971 | Sakai | 325/417 |
| 3,789,262 | 1/1974 | Backwinkel | 325/470 |
| 3,859,610 | 1/1975 | Rhee | 325/468 |

Primary Examiner—Benedict V. Safourek
Assistant Examiner—Michael A. Masinick

[57] ABSTRACT

A circuit for storing of tuning-in to preselected stations for receivers provided with electronic tuning, in which the voltage supplied from a charged capacitor onto variable reactance elements, such as capacitance diodes, included in tuned resonant circuits of the receiver, required to realize the tuning-in to preselected stations, is stored by means of electrochemical integrators. The storage is realized by recording the electric charge fed to the capacitor with constant capacitance to obtain thereon a voltage having a value required to tune-in the receiver to reception of the desired station. At reproducing of the tuning-in to the given station, the charging circuit of the capacitor supplying the tuning voltage becomes blocked on feeding to the capacitor the previously recorded quantity of the electric charge, which is signalled by instantaneous increase of the resistance of the electrochemical integrator. The control of the charging circuit becomes switched-over on the automatic tuning circuit by means of a signal from the detector.

5 Claims, 4 Drawing Figures

MEMORY CIRCUIT FOR TUNING OF AN ELECTRONICALLY TUNED RECEIVER TO A PRESELECTED STATION

The subject of the present invention is a memory circuit for tuning of electronically tuned receivers to preselected stations, which allows for an instant switching over from one received station to another within a range covering several preselected broadcast, television or radiotelephone transmitters without the previously necessary manipulation of the tuning system of the receiver.

The said circuit can be used in electronically tuned equipment, where the tuning is effected by varying the value of the d.c. voltage applied to circuit elements of variable reactance, for instance, to variable capacitance diodes included in the input and heterodyne resonant circuits.

It is particularly easy to use this circuit in such receivers with automatic station finding and tuning-in, where the tuning voltage is generated in the form of highly linear ramp rising continuously up to the point corresponding to the tuning-in to an encountered station.

Known memory tuning circuits used in electronic tuning systems are exclusively associated with manual receiver tuning by means of potentiometers controlling the variable capacitance diodes in the resonant circuits. Required in such a case is a smooth voltage control and a high stability of the voltage applied to the potentiometer. Once the setting of the tuning potentiometer is fixed, it ensures that every time the voltage preset on the potentiometer is applied to the resonant circuits the same station is received. The use of a plurality of similar precision potentiometers, connected to the tuning circuits by means of push-button switches, makes it possible to preset each potentiometer for the reception of a different station and to hear or see a selected program or to communicate with a selected station of a radio communication system by depressing of a corresponding push-button.

In automatic tuning circuits the tuning data can not be stored, since the tuning voltage is taken from a sweep generator producing a linearly rising ramp voltage to tune the receiver in a single stroke over a definite band of received frequencies. The rise of the ramp voltage is stopped at a level corresponding to an encountered station by a special cut-off circuit, which is driven by the output signal of the detector of the receiver and interrupts the charging of the capacitor, whose voltage controls the variable capacitance diodes. The detector output signal is at the same time used for the maintenance of optimum tuning conditions by switching on of additional charging, when the detector output signal decreases. If the listener does not like the selected program, he uses a push-button to make the automatic tuning circuit to continue the search. After switching off of the power supply the receiver becomes detuned and when the power supply is switched on again, the previously selected station must be found by tuning the circuit from one station to another once again. This disadvantage of the automatically tuned receivers can only partially be cured by reducing the sensitivity of the receiver for the period of search of the desired station to limit the selection to the strongest signals.

The circuit according to the invention enables electronically tuned receivers to store the tuning data of the received stations owing to the series insertion into the charging circuit of the capacitor, constituting the voltage source for the variable reactance elements such as, for instance variable capacitance diodes in the input and heterodyne circuits, of at least one electrochemical integrator, which electrochemically records the value of the electric charge supplied to the capacitor to charge it to the voltage necessary for the tuning-in to a given station. The integrator is inserted into the capacitor charging circuit by means of a switch allowing for the reversal of the insertion polarity, which originally existed during tuning-in to the selected station. Connected in parallel to the integrator is a voltage step detector, which controls the capacitor charging circuit by means of a switching element in such a manner that, if a voltage step occurs during tuning reproduction, the charging of the capacitor is cut-off. To reproduce the recorded tuning the insertion polarity of the integrator is reversed by means of a switch, so that the charge being supplied to the capacitor passes through the integrator in the reverse direction and causes the reversal of the direction of transport of the metallic particles, i.e., resets the integrator. Resetting of the integrator is accompanied by a voltage step across the integrator which means that released has been the same amount of electric charge as it was necessary for the tuning to the desired station.

Supplying equal amount of electric charge to the capacitor of constant capacitance results in the reproduction of the voltage, which has been previously applied to the variable capacitance diodes during tuning to the selected station.

To provide a precise tuning to the selected station and to maintain it the capacitor is additionally charged by means of the charge control circuit, which is driven with a signal taken from the output of the detector of the receiver, preferably the "S" curve detector. To allow the tuning to the selected station to be repeatedly reproduced one uses two cascaded electrochemical integrators with mutually opposite polarities and inserted in series into the capacitor charging circuit. A switch makes it possible to record the tuning on one integrator and to reproduce it using two integrators connected in cascade.

In such an arrangement, when one integrator is reset to reproduce the tuning, the other records the value of the electric charge which has been recorded in that integrator. Thus the process of tuning to a given station can be repeated for many times. To cancel the stored tuning data one reproduces the tuning process with one integrator switched on. To record the tuning data of a plurality of stations one sequentially selects individual electrochemical integrators or pairs of integrators from the memory set and inserts into the charging circuit of the tuning voltage storage capacitor.

The whole process of tuning-in to a given station is recorded for every recording cycle starting from zero tuning voltage. This feature of the circuit makes it particularly suitable for the receivers with automatic station finding and tuning-in, which are equipped with generators of the ramp voltage fed into the tuning circuits to sweep the band and tune the receiver in to an encountered station.

Another solution of a memory system for the recording of the tuning-in to several selected stations by means of electrochemical integrators is a system comprising a plurality of circuits composed of capacitors and electrochemical integrators connected in series, the tuning-in voltage being applied to them to record the amount of the electric charge supplied to the capacitor of the selected memory circuit to obtain the tuning-in voltage across it.

Each memory circuit is equipped with a switch allowing for the change-over of the insertion polarity of the integrator, the voltage drop occurring across the electrochemical integrator being applied to the voltage step detector circuit. The voltage step generated by the integrator switches over the capacitor charging control circuit onto the output of the detector of the receiver. The voltage arising across the memory circuit capacitor is fed into the tuning circuits to reproduce the tuning-in to the selected station.

The tuning-in memory circuit according to the present invention ensures a durable, shock-resistant and power supply stability independent tuning of the receiver to the selected stations, these features being particularly important in portable and automobile equipment. The system makes it possible to record a considerable number of stations, because it does not require the installation of trimmer potentiometers at the front panel of the receiver and, from the other side, the small dimensions of the electrochemical integrators allow for the mounting of a great quantity of them inside the housing of the receiver. When interconnected with a timer, the system enables full automatization of receiver tuning to be made, since the transmissions emitted by various stations at different hours can be received according to a preset program of reception. In radiocommunication systems, which do not require precise maintenance of transmitted frequencies as it is, for instance, in local radiotelephone networks, the circuit allows for setting up of radio communication based upon the reproduction of the transmitted frequencies by applying of the recorded tuning-in voltage to the elements of variable reactance included in the resonant circuits of transmitted frequency generators.

Figure 2:
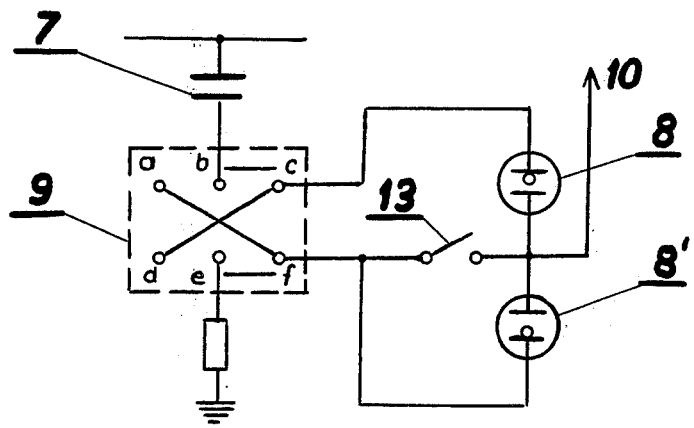
Figure 3:
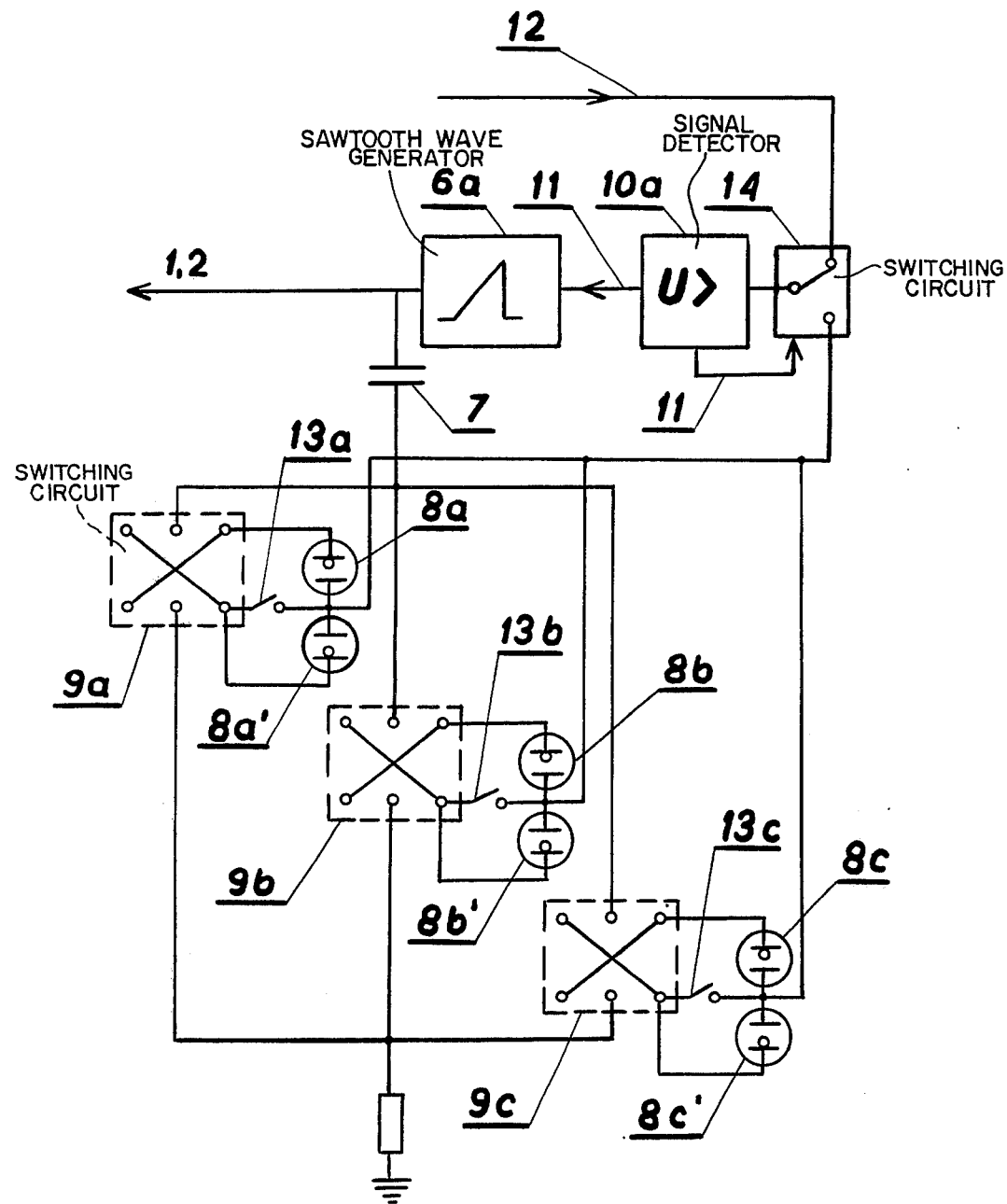
Figure 4:
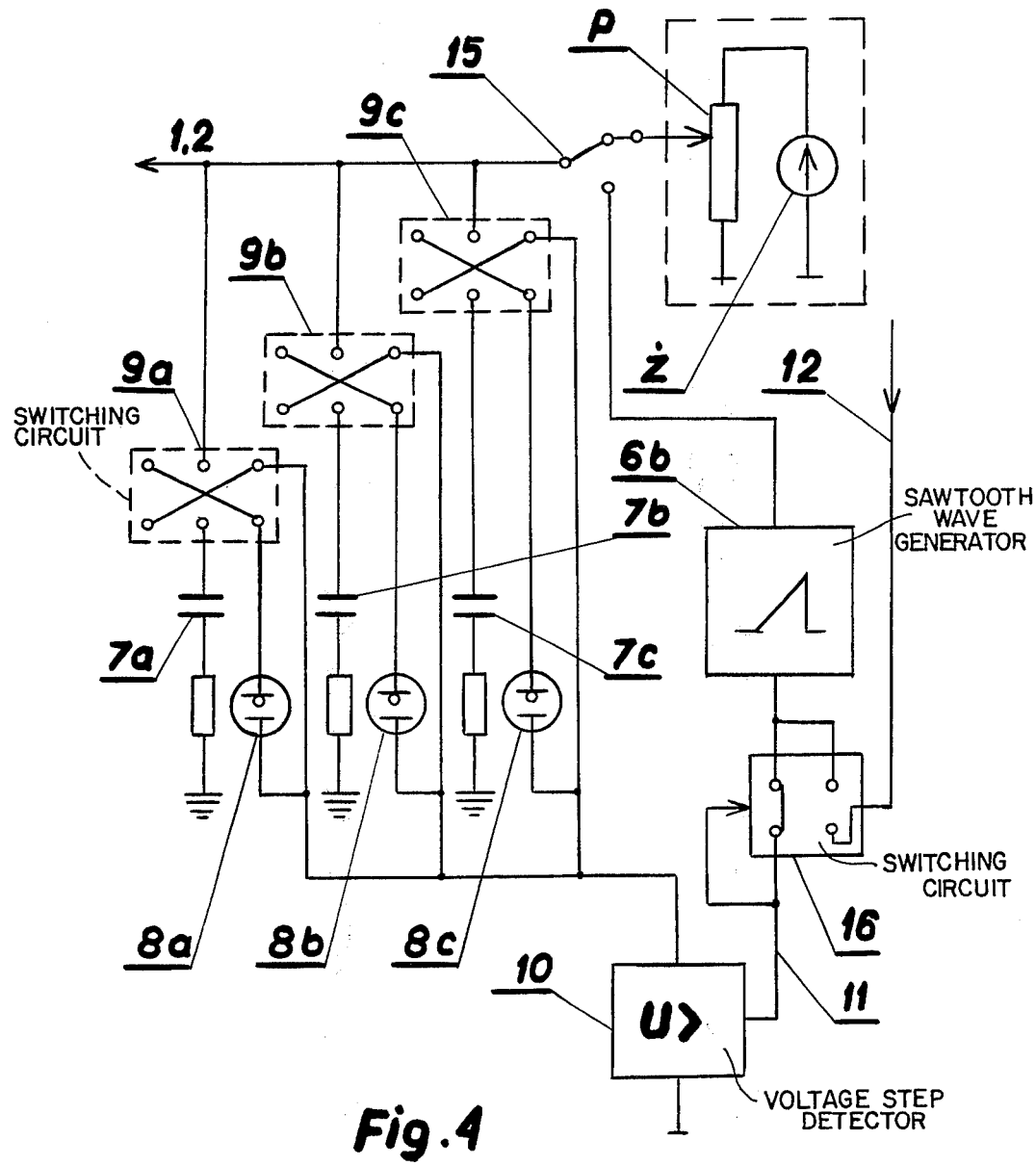

A more detailed description of the subject of the present invention is given in the examples of implementation shown in the enclosed drawing, where FIG. 1 illustrates the block diagram of a receiver with electronic tuning and the tuning-in memory circuit according to the present invention, FIG. 2 represents the tuning-in memory circuit for repeated reproduction built on two electrochemical integrators, FIG. 3 shows the tuning-in memory circuit for a receiver with automatic station finding and tuning-in to a station, FIG. 4 shows the tuning-in memory circuit designed for a receiver tuned manually by means of a potentiometer.

The receiver shown in FIG. 1 consists of: an input circuit 1, tuned for the reception of electric signals of definite frequency by means of variable capacitance diodes included in the resonant input circuits, a superheterodyne oscillator 2, which is also tuned by means of variable capacitance diodes included in its resonant circuits, an intermediate frequency amplifier 3, a detector 4, an output stage 5, a charging circuit 6, a capacitor 7, which stores the tuning voltage applied to the variable capacitance diodes included in the input circuit 1 and the superheterodyne oscillator 2. The receiver is equipped with a tuning-in to a selected station memory circuit consisting of an electrochemical integrator 8, inserted in series with the charging circuit of capacitor 7 by means of switch 9 enabling the insertion polarity to be reversed. Connected in parallel to the integrator 8 is the voltage step detector 10 driving in turn the charging circuit 6 through link 11. The charging circuit 6 can also be driven by the output signal of the detector 4 through connection 12 after switching-over of the control circuit. The charging circuit 6, containing a constant-current source or a ramp generator, charges the capacitor 7 so, that the voltage across its terminals rises. This voltage is then applied to variable capacitance diodes in tuning circuits to bias them in the reverse direction and to control the variation of their capacitance.

The capacitance of the diodes decreases with increasing bias voltage and results in tuning-in of the receiver to ever increasing frequencies. When the receiver is already tuned-in to the selected station one disconnects the charging circuit 6 by means of push-button switch R and shorts the electrochemical integrator 8 by shorting contacts bc and de of switch 9.

In such a way the electrochemical integrator 8 records the amount of electric charge, which has been supplied to capacitor 7 to produce a voltage necessary for the variable capacitance diodes to tune-in to the selected station. The recording is electrochemical in nature and is effected by the transport of a metal mass from the output electrode onto the storage electrode as a result of the current flow in the charging circuit of capacitor 7. To reproduce the tuning-in to the selected station one inserts the electrochemical integrator into the charging circuit of capacitor 7 at the same time reversing its polarity by shorting contacts ab and de of switch 9. After switching on of the charging circuit 6 the capacitor 7 is charged, the charging current, however, flows in an opposite direction through the integrator 8 and transports the metal mass from the storage electrode back to the output electrode. A complete transfer of metal from the storage electrode to the output electrode is accompanied by a considerable increase in the internal impedance of the electrochemical integrator 8, which results in a stepwise rise of the voltage drop across the integrator. The voltage step across the integrator 8 triggers the overvoltage detector 10, which cuts off the charging of capacitor 7 through control connection 11.

The operation of the electrochemical integrator as well as the construction thereof are known, for example, from U.S. Pat. No. 3,544,853 to S. Giles.

The electrochemical integrator is a commonly available element, and may be found, for example, in the catalog "Plesscy Electroproducts E-cell Device."

The electrochemical integrator is a device suitable for registering the quantity of the electric charge transmitted by the current flowing therethrough from the source (output) electrode towards the collector, and transferring the mass of metal from one electrode onto the other. The integrator is an element carrying the constant current from the source electrode towards the collector. It has the feature of relatively low resistance, causing thereby a relatively small voltage drop. In the opposite sense the current is carried through the integrator under the same conditions but only within the range of the quantity of electric charge, which has been previously carried over from the source electrode to the collector. On carrying the previously recorded electric charge in the opposite sense of flow, implying transferring the mass of metal accumulated on the collector, the resistance of the integrator increases instantaneously. Accordingly, the voltage thereon drops gradually. Those electric characteristics of the electrochemical integrator are utilized in the arrangement according to the present invention. The occurrance of a voltage step across integrator 8 means, that capacitor 7 received the same amount of electric charge as during tuning-in to the selected station, i.e., that the voltage applied to the variable capacitance diodes in the tuning circuits is equal to the voltage necessary for tuning-in of the receiver to the same previously selected station. To maintain the tuning-in to the station being received the charging circuit 6 is driven by means of the output signal from detector 4 fed-in trough connection 12. The overvoltage detector 10 limits the voltage drop across integrator 8 to prevent it from damage and disables it by shunting when the charging circuit 6 of capacitor 7 is switched off.

FIG. 2 shows a tuning-in memory circuit for repeated tuning to the selected station. Inserted into the charging circuit of capacitor 7 by means of switch 9 is a set of two cascaded electrochemical integrators 8 and 8', whose polarities are mutually opposite. The circuit is equipped with a switch 13, which in the closed state switches on only one integrator, while in the open state it switches the set of two cascaded integrators in such a manner, that when one of the integrators is reset, the other records the same amount of the electric charge as it was supplied during tuning-in. To cancel a recorded tuning-in one must only reproduce this tuning at one integrator 8 switched on.

Shown in FIG. 3, is a circuit solution for the recording of tuning-in to a plurality of stations designed for a receiver with automatic station finding, which is equipped with a ramp generator 6a performing the role of the charging circuit of capacitor 7 and a signal detecting circuit 10a connected to the output of the detector of the receiver and used as voltage step detector during reproduction. Switches 9a, 9b, 9c insert pairs of integrators 8, 8' into the charging circuit of capacitor 7 to allow for the recording of tuning-in to particular stations and future repeated reproduction.

Switching circuit 14 switches over the signal detection circuit from output of the receiver detector 4 to the integrators 8 to monitor the voltage drop during reproduction, a suitable matching being provided.

To record the tuning-in to a given station, the electrochemical integrator 8 inserted into the charging circuit of capacitor 7 records the entire capacitor charging process controlled by generator 6a, which is stopped at the reception of every encountered station and must be started by means of a push-button switch to proceed to a next station. During reproduction, after switching over of the signal detector 10a from the output of the receiver detector 4 to integrators 8 to monitor the voltage drop and after the reversal of the plurality of the integrators by means of switch 9, the generator 6a is stopped only after the voltage on capacitor 7 attains the value corresponding to the tuning-in to the selected station.

After switching off of the receiver and switching it on again the memory circuit ensures an automatic tuning-in to the previously selected station.

Shown in FIG. 4 is a multiple memory circuit for a receiver with manual electronic tuning by means of a potentiometer controlling the bias voltage of the variable capacitance diodes in the tuned circuit. Used here are several capacitors 7a, 7b, 7c and electrochemical integrators 8a, 8b, 8c, the said integrators being inserted into the charging circuits of the said capacitors by means of switches 9a, 9b, 9c, which provide for the charging voltage set by the tuning potentiometer P and for the reversal of the polarity of integrators.

The potentiometer P is supplied from a stabilized voltage source Z. During reproduction of tuning-in the tuning voltage is taken from capacitor charged by means of the ramp generator 6b, which is connected to the charging circuit by means of switch 15. The electrochemical integrators 8a, 8b, 8c of the individual memory circuits are connected to a common overvoltage detector 10, detecting the voltage step across the integrator used for the reproduction of the tuning-in. During reproduction of tuning-in the overvoltage detector 10 is connected by means of switch 16 to the control circuit of generator 6b. After the reproduction of tuning-in the generator 6b is controlled by the output signal of the receiver detector 4. To record the tuning-in to the selected station, obtained by proper setting of the potentiometer controlling the voltage fed to the variable capacitance diodes in the tuning circuits, one applies this voltage to one of the memory circuits by means of a switch, for instance, switch 9a. Capacitor 7a is then charged up to the value of this voltage, the electric charge stored in capacitor 7a being at the same time recorded in the electrochemical integrator 8a connected in series with the capacitor. Thus, the recording of the conditions of tuning-in to the selected station have been completed. To reproduce the tuning-in one switches over the switch 15 to apply the output voltage of generator 6b to variable capacitance diodes. At the same time capacitor 7a is charged through the electrochemical integrator 8a, whose polarity has been reversed by means of switch 9a.

The overvoltage detector 10 stops the generator 6b at the moment of occurrence of a voltage step across the integrator 8a. The voltage step means that the capacitor has been charged with an electric charge corresponding to the tuning-in to the selected station.

It is advisable to leave one memory section free in the circuit from FIG. 4, for instance, the section incorporating capacitor 7c to allow the previous tuning-in recorded, for instance, in the circuit of capacitor 7a, to be repeated.

The repetition is made by applying the tuning-in voltage to the free circuit. The reproduction of the recorded tuning-in resets the memory circuit, which can be used for the duplication of the tuning-in recorded in another memory circuit. Thus, one can use one integrator instead of two for the duplication of tuning-in.

The examples of memory circuits given above can be used in various combinations, depending on the functional requirements which are to be met.

I claim:

1. An arrangement for storing a tuning voltage of preselected stations for receivers having electronic tuning with elements of variable reactance having elements comprising capacitance diodes and being dependent on the applied bias voltage, comprising in combination, input circuit means having elements comprising capacitance diodes, said input circuit means being tuned for reception of electrical signals at predetermined frequency by means of said capacitance diodes, said input circuit means comprising tuned resonant circuit means, a superheterodyne oscillator having elements comprising capacitance diodes and being connected to said input circuit means, said oscillator being also tuned by the capacitance diodes in said oscillator, a detector connected to the output of said input circuit means, capacitor means connected to said input circuit means and said oscillator for storing the tuning voltage applied to said elements in said input circuit means and said oscillator, a charging circuit connected to said capacitor means and controlled from the output of said detector means, at least one electrochemical integrator connected in series with said capacitor means, switching means connected between said integrator and said capacitor means for reversing interconnections between said integrator and said capacitor means, a voltage step detector connected in parallel with said integrator, said charging circuit being controllable from said voltage step detector or from the output of said detector means after actuating said switching means.

2. The arrangement as defined in claim 1 wherein said at least one electrochemical integrator comprises two electrochemical integrators connected in series in opposite polarity with respect to each other in said charging circuit, and auxiliary switching means bridging one of said two integrators in said charging circuit.

3. The arrangement as defined in claim 1 wherein said at least one electrochemical integrator comprises a set of electrochemical integrators in said charging circuit, and a set of switches between said set of electrochemical integrators and said stations, said receivers having automatic scanning and tuning.

4. The arrangement as defined in claim 1 wherein said at least one electrochemical integrator comprises a set of pairs of electrochemical integrators in said charging circuit, and a set of switches between said electrochemical integrators in said charging circuit and said stations, said receivers having automatic scanning and tuning.

5. The arrangement as defined in claim 1 wherein said capacitor means comprises a plurality of capacitors, said at least one electrochemical integrator comprising a plurality of electrochemical integrators, said switching means comprising a plurality of switches connected between said capacitors and electrochemical integrators for switching-on the tuning voltage and changing the bias voltage, each electrochemical integrator being connected to said voltage step detector for controlling said charging circuit.

* * * * *